US009082809B2

(12) United States Patent
Dabrowski et al.

(10) Patent No.: US 9,082,809 B2
(45) Date of Patent: Jul. 14, 2015

(54) GRAPHENE BASE TRANSISTOR HAVING COMPOSITIONALLY-GRADED COLLECTOR BARRIER LAYER

(75) Inventors: Jaroslaw Dabrowski, Frankfurt (DE); Wolfgang Mehr, Friedersdorf (DE); Johann Christoph Scheytt, Frankfurt (DE); Grzegorz Lupina, Berlin (DE)

(73) Assignee: IHP GmbH—Innovations for High Performance Microelectronics, Frankfurt (DE)

( * ) Notice: Subject to any disclaimer, the term of this patent is extended or adjusted under 35 U.S.C. 154(b) by 341 days.

(21) Appl. No.: 13/473,873

(22) Filed: May 17, 2012

(65) Prior Publication Data

US 2012/0292596 A1 Nov. 22, 2012

(30) Foreign Application Priority Data

May 17, 2011 (EP) .................................... 11166332
Nov. 24, 2011 (EP) .................................... 11190486

(51) Int. Cl.
*H01L 29/06* (2006.01)
*H01L 29/737* (2006.01)
*H01L 29/08* (2006.01)
*H01L 29/10* (2006.01)
*H01L 29/16* (2006.01)
*H01L 29/76* (2006.01)

(52) U.S. Cl.
CPC ........ *H01L 29/7376* (2013.01); *H01L 29/0821* (2013.01); *H01L 29/0895* (2013.01); *H01L 29/1004* (2013.01); *H01L 29/1606* (2013.01); *H01L 29/7606* (2013.01)

(58) Field of Classification Search
None
See application file for complete search history.

(56) References Cited

U.S. PATENT DOCUMENTS

2012/0068157 A1* 3/2012 Kub .............................. 257/15

FOREIGN PATENT DOCUMENTS

| EP | 0314836 | 5/1989 |
|---|---|---|
| EP | 2221874 | 8/2010 |
| WO | WO 2010/072590 | 7/2010 |

OTHER PUBLICATIONS

Qin Zhang, et al.; "Graphene Nanoribbon Tunnel Transistors"; IEEE Electron Device Letters, IEEE Service Center, NY, NY; vol. 29, No. 12; Dec. 1, 2008; pp. 1344-1346 (whole document).
Liang Gengchiau, et al.; "Ballistic Graphene Nanoribbon Metal-Oxide-Semiconductor Field-Effect Transistors: A Full Real-Space Quantum Transport Simulation"; Journal of Applied Physics, American Institute of Physics, NY; vol. 102, No. 5; Sep. 11, 2007; pp. 54307-54307 (whole document).
S. Akcoltekin, et al.; "Graphene on Insulating Crystalline Substrates"; Nanotechnology, vol. 20, No. 15, 155601; Apr. 2, 2009; pp. 1-6 (whole document).

(Continued)

*Primary Examiner* — Kyoung Lee
(74) *Attorney, Agent, or Firm* — Ware, Fressola, Maguire & Barber LLP

(57) ABSTRACT

A junction transistor, comprising, on a substrate an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer, characterized in that the collector barrier layer is a compositionally graded material layer, which has an electron affinity that decreases in a direction pointing from the base layer to the collector layer.

16 Claims, 8 Drawing Sheets

(56) References Cited

OTHER PUBLICATIONS

Sollner, et al.; "Resonant Tunneling Through Quantum Wells at Frequencies up to 2.5 THz"; American Institute of Physics; Jul. 1, 1983; pp. 588-590.

S. Luryi; "An Induced Base Hot-Electron Transistor"; IEEE Electron Device Letters; vol. EDL-6, No. 4; Apr. 1985; pp. 178-180.

S. Cahangirov, et al; "Two- and One-Dimensional Honeycomb Structures of Silicon and Germanium"; The American Physical Society; Jun. 12, 2009; pp. 236804-1 through 236804-4.

C.A. Mead; Operation of Tunnel-Emission Devices:; Journal of Applied Physics; vol. 32, No. 4; Apr. 1961; pp. 646-652.

Keiji Ikeda; et al; "Modulation of NiGe/Ge Schottky Barrier Height by Sulfur Segregation During Ni Germanidation"; American Institute of Physics; Apr. 14, 2006; pp. 152115-1 through 152115-3.

Q.T. Zhao, et al.; "Tuning of NiSi/Si Schottky Barrier Heights by Sulfur Segregation During Ni Silicidation"; American Institute of Physics; Feb. 2, 2005; pp. 062108-1 through 062108-3.

Mieko Matsumura, et al; "Extraction of Capacitance of a Metal Oxide Semiconductor Tunnel Diode (MOSTD) Biased in Accumulation"; Japanese Journal of Applied Physics; vol. 38, No. 8A; Aug. 1, 1999; pp. L845-L847.

M. Houssa, et al; "Electronic Properties of Two-Dimensional Hexagonal *Germanium*"; American Institute of Physics; Feb. 25, 2010; pp. 082111-1 through 082111-3.

Yoshinori Tsuchiya, et al; "Material Characterization of Metal Germanide Gate Electrodes Formed by Fully Germanided Gate Process"; Japanese Journal of Applied Physics, vol. 45, No. 4b: Apr. 25, 2006; pp. 2925-2932.

Mordehat Heiblum; "Tunneling Hot Electron Transfer Amplifiers (Theta): Amplifiers Operating Up to the Infrared"; Solid-State Electronics, vol. 24, Aug. 1980; pp. 343-366.

Christopher Henkel, et al; "Reduction of the PtGe/Ge Electron Schottky-Barrier Height by Rapid Thermal Diffusion of Phosphorous Dopants"; Journal of the Electrochemical Society; Jun. 16, 2010; pp. H815-H820.

Serge Luryi, et al; "Hot-Electron Transport in Heterostructure Devices"; North-Holland Physics Publishing Division; 1985; pp. 453-465.

\* cited by examiner

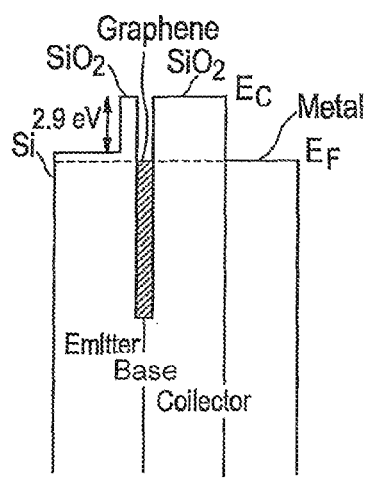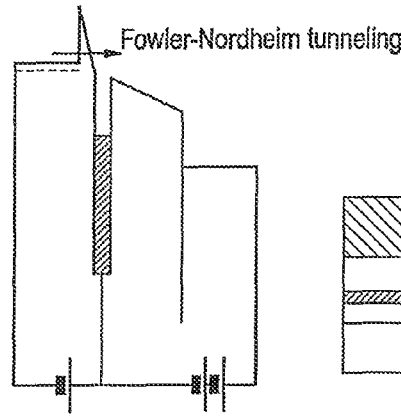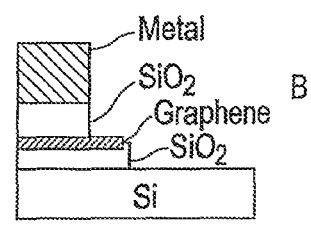
Fig. 1(a)　　　Fig. 1(b)　　　Fig. 1(c)
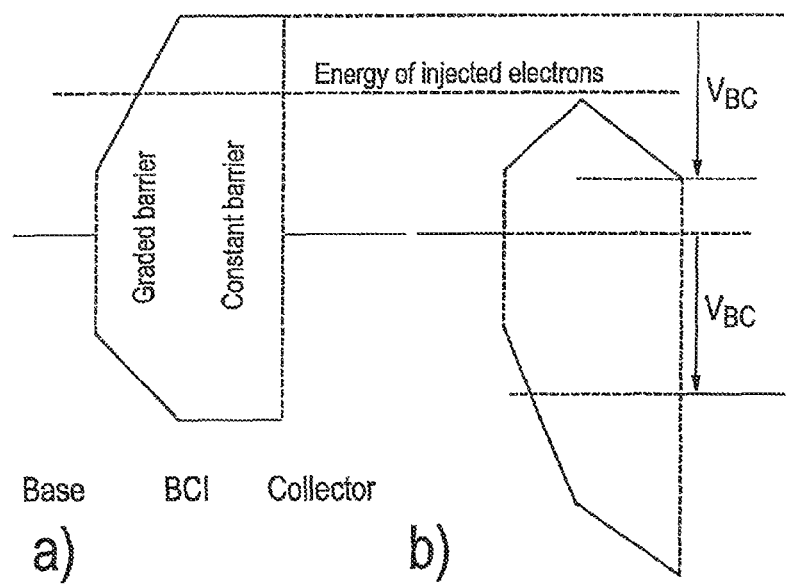
Fig. 2

GRAPHENE BASE TRANSISTOR HAVING COMPOSITIONALLY-GRADED COLLECTOR BARRIER LAYER

CROSS REFERENCE TO RELATED APPLICATIONS

This application claims priority under 35 USC §119 to European Patent Application No. 11 166 332.4 filed on May 17, 2011 and European Patent Application No. 11 190486.8 filed on Nov. 24, 2011, which applications are hereby incorporated by reference.

TECHNICAL FIELD

The present invention relates to a junction transistor, comprising an emitter layer, a collector layer, and a base layer that comprises a graphene layer, wherein an emitter barrier layer is arranged between the base layer and the emitter layer, and a collector barrier layer is arranged between the base and the collector.

BACKGROUND OF THE INVENTION

Carbon-based materials are considered as having a great potential to improve digital and radio frequency (RF) electronics.

Graphene is a name given to a single layer of carbon atoms arranged in a honeycomb lattice, although also films built of few graphene sheets stacked one upon another are often referred to as graphene (or few-layer graphene) and shall also be considered as embodiments of a graphene layer herein. Single-layer graphene is a zero band gap semiconductor with outstanding material properties, such as charge carrier mobility of around $1.2 \times 10^5$ cm$^2$/Vs at 240 K, high field electron velocity of $4 \times 10^7$ cm/s, sheet resistance as low as 125 Ω/sq (about 30 Ω/sq for four-layer films), and thickness of only 0.34 nm.

Most of the work on graphene devices has been so far devoted to field-effect transistors with graphene channel (GFETs). These transistors use single-layer graphene, because field effect in thicker films is hampered by screening, which strongly reduces the transconductance.

Although the realization of a logic switch based on GFET is hindered by the lack of band gap in graphene, this material may have a great potential for RF applications. This field of graphene research has recently attracted a great interest of physicist and device engineering community and resulted in realization of RF graphene field effect transistors (GFET) with cut off frequency (fT) of 100 GHz, ambipolar graphene RF mixers, and graphene frequency multipliers. Despite the fact that GFETs show promising results in terms of fT and noise, the absence of a pronounced drain current saturation in these devices limits their potential for RF amplifying circuits. For this reason alternative concepts are of high interest.

A high-performance RF (radio frequency) junction transistor is known from WO 2010/072590. Control of operation of such a transistor is performed by driving a tunnel junction, which allows a flow of charge carriers in one direction when subjected to an operation voltage.

SUMMARY OF THE INVENTION

According to the present invention, a junction transistor comprises an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer, wherein the collector barrier layer is a compositionally graded material layer, which at an interface between the base layer and the collector barrier layer has a higher electron affinity than at an interface between the collector layer and the collector barrier layer.

In the transistor structure of the present invention, the emitter barrier layer is preferably configured to block a charge carrier transport between the emitter layer and the base layer under application of an emitter-base voltage having an amount below a threshold amount and to allow charge carriers passing the emitter barrier layer between the emitter and the base under an application of an emitter-base voltage above the threshold amount between the emitter and the base. The transport mechanism at the emitter barrier layer is a tunnelling transport.

On the other side, the collector barrier layer is preferably configured to avoid a current of charge carriers between the base layer and the collector layer in absence of a carrier injection from the emitter layer into the base layer.

The junction transistor of the present invention achieves a particular band structure profile with a conduction-band profile defined by a conduction-band edge that defines a lower limit of energy of allowed states of electrons as a function of the position across the graphene layer and the collector barrier layer in a direction pointing form the base layer to the collector layer. The conduction-band profile has a step-like increase in energy at an interface between the graphene layer and the collector barrier layer and, in correspondence with the composition grading, a monotonous decrease of the lower conduction band edge with increasing distance from the base layer in the direction pointing from the base layer to the collector layer.

By providing a collector barrier layer, in which an energy-barrier for electrons in their motion from the graphene layer towards the collector layer decreases with increasing distance from the base, the junction transistor of the present invention allows achieving a high collector current, low base currents and—in some embodiments—a high output power. The energy barrier is defined as defined above by the profile of the lower edge of the conduction band as a function of position across the graphene layer and the collector barrier layer. In particular, the energy barrier of the junction transistor of the present invention provides a high transparency to electrons when an operating voltage is applied to the transistor and allows avoiding the formation of a tunneling barrier for electrons, and, at least to a large extent, the occurrence of quantum reflection at the interface between the graphene layer and the collector barrier layer.

A monotonous decrease of energy is to be understood in a mathematical sense, i.e., as a decreasing profile that may include a section with constant energy but must not contain a section with increasing energy.

A compositionally graded material is to be understood as a composite material, in the present context a layer of a solid-state material, which may be defined by at least two material components that assume defined fractions of a unit quantity of the composite material. All fractions add up to 100%, but the fractions of the individual components change as a function of position in a certain direction. In the present case, the direction points from the base layer to the collector layer. Non-restrictive examples of a compositionally graded material layer form a mixture or an alloy.

In the following, embodiments of the junction transistor of the present invention will be described.

A transistor of this kind may have a base layer that consists of the graphene layer, which in one embodiment has a thickness as low as one atomic layer.

In one embodiment, the collector barrier layer is a composite dielectric material, the electron affinity of which decreases linearly with increasing distance from the base layer. It is important to note that there is no implicit or mandatory correspondence whatsoever between the electron affinity and the dielectric constant. A dielectric constant of the compositionally graded material is in some embodiments nearly constant across the collector barrier layer.

In other embodiments, however, the dielectric constant of the collector barrier layer does decrease with increasing distance from the base layer in a direction pointing from the base to the collector. For instance, in a suitable profile the dielectric constant decreases from a value between 40 and 60 at an interface between the graphene layer and the collector barrier layer, to a value between 3 and 5 at an interface between the collector barrier layer and the collector.

Preferably, the collector barrier layer comprises a sublayer arranged adjacent to the collector layer and having an electron affinity that does not change with increasing distance from the base layer. For instance, the collector barrier layer comprises a silicon dioxide layer adjacent to the collector layer. By using silicon dioxide, sufficient dielectric strength for a high collector voltage (10-20 V), as needed for good power performance, is assured. If a lower collector voltage is needed for specific application purposes, the $SiO_2$ sub-layer may be substituted by a constant-composition extension of a compositionally graded part of the collector barrier layer. Thus, the composition profile can be designed to provide the desired potential shape at the operation output voltage.

The compositionally graded collector barrier layer may comprise a compositionally graded $Si_xTi_{1-x}O_2$ layer on the silicon dioxide layer and, as an option, a $SrTiO_3$ layer at the interface between the collector barrier layer and the base. The $Si_xTi_{1-x}O_2$ layer may be understood as a composite material comprising the components $SiO_2$ and $TiO_2$ at fractions varying in position. Another way of notation is $(SiO_2)_x(TiO_2)_{1-x}$.

If the silicon dioxide layer is present, its thickness is preferably between 5 and 30, suitably between 10 and 30 nanometer, even more suitably between 15 and 20 nanometer. The compositionally graded $Si_xTi_{1-x}O_2$ layer suitably has thickness of between 10 and 90 nanometer, in some embodiments between 20 and 40 nanometer. And the SrTiO3 layer, if present at all, has a thickness of between 0.5 and 3 nanometer, preferably about 1 nanometer. As mentioned, the $SrTiO_3$ layer may be omitted.

Suitably, the collector layer is made of silicon. The conduction band offset between Si and $TiO_2$ is about 0 to 0.4 eV, and between Si and $SrTiO_3$ is about 0 to 0.2 eV. An alignment of the tunnelling barrier to the emitter material is possible by choosing TiN for the emitter layer. The alignment in this case is also good with respect to the Fermi level in graphene, which is roughly aligned with that of TiN and can be around 0.5 eV.

In an alternative embodiment, the junction transistor has a collector barrier layer that comprises a $Ta_2O_5$ layer at the interface between the collector barrier layer and the collector, and a compositionally graded $Ta_xTi_yO$ layer at the interface between the collector barrier layer and the base. The conduction band of $Ta_2O_5$ is about 0.4 eV above the conduction band of $TiO_2$ In further embodiments to be described in the following, additional performance improvements can be achieved by a particular design and combination of the emitter layer and the emitter barrier layer. The emitter barrier layer must support high currents in the tunneling regime. Hence, in preferred embodiments the emitter barrier layer forms a rather low tunneling barrier, preferably in the range of 0.5 eV or less. This can be achieved in different alternative ways. In one embodiment, the layer sequence of emitter layer and emitter barrier layer is formed by a metallic emitter layer and a thin dielectric layer. Preferably, in this configuration, the dielectric layer has a thickness below 5 nanometer, in particular of about 3 nanometer. A potential disadvantage of this configuration is the presence of a high electric field in the emitter barrier layer.

As an alternative, the emitter layer of one embodiment is a highly doped (degenerate) semiconductor layer and the emitter barrier layer is an epitaxial intrinsic or near-intrinsic semiconductor layer ($n^{++}$-i junction) of a moderate thickness, such as for instance in the range between 20 and 50 nm, preferably between 25 and 35, suitably about 30 nanometer. In this embodiment, the electric field in the emitter barrier layer is low under operation conditions. The barrier profile of the emitter barrier layer as a function of position in a direction pointing from the emitter layer to the base layer may be designed either by a doping or by composition grading of the nominally intrinsic part. Such an optimization of the barrier shape helps to achieve a good transconductance at the working point of the junction transistor, and at the same time maintain the base current sufficiently low. A potential disadvantage of this configuration is the increased thickness of the emitter barrier layer, which in turn increases the thickness of the device.

In a preferred embodiment, the emitter barrier layer forms a tunneling barrier, which under operation at predefined base and collector voltages has an amount, i.e., a step height that is approximately the same, or not significantly lower than the barrier height of the collector barrier on the base side. This avoids a reflection of electrons from the collector barrier layer, which would otherwise result in the base leads collecting the reflected electrons.

Regarding the material choice for the emitter layer and the emitter barrier layer, the first of the above-mentioned two alternative embodiments includes a metallic emitter layer that either comprises or consists of a titanium nitride layer. In this embodiment, different choices exist for the emitter barrier layer. A suitable emitter barrier layer comprises, arranged adjacent to the titanium nitride layer, a layer of Si (001), Ge (001), GaAs, $Ta_2O_5$, or $TiO_2$. Germanium has the advantage of lower effective mass for electrons (0.082, as compared to 0.19 for Si). GaAs has also a low effective mass for electrons (0.067), and in addition is a direct-gap semiconductor, which makes tunneling sufficiently efficient even through an amorphous ultrathin GaAs film.

The second of the alternative embodiments for the layer sequence of emitter layer and emitter barrier layer includes in different alternative embodiments an $Er_2Ge_2$/Ge layer stack, a $n^{++}$-Si(001)/i-Si(001) layer stack, a $n^{++}$-Ge(001)/i-Ge(001) layer stack, or a $n^{++}$-GaAs(001)/i-GaAs(001) layer stack, wherein the Ge, i-Si(001), i-Ge(001) or the i-GaAs(001) forms the respective emitter barrier layer and is arranged between the emitter layer and the base layer, preferably adjacent to the graphene layer. With GaAs, the emitter barrier on the base side increases. Alloying with AlAs is an option for optimization of the energy barrier profile formed by the emitter barrier layer.

Another interesting material choice for the emitter barrier layer or a sub-layer of the emitter barrier layer is BN. Boron nitride has shown a potential for providing a particularly suitable substrate for the fabrication of a graphene layer. At the same time, BN provides advantageous dielectric properties. Preferably, BN is provided with a thickness of between 1 and 10 monolayers.

In the following, additional embodiments will be described with reference to the Figures.

In the graphene base transistor (GBT) of the present invention, graphene is not used as a high mobility channel as in a field-effect device, but instead as an extremely thin, low resistivity electrode. The GBT thus combines the concept of a hot electron transistor with the unique properties of graphene to result in a high frequency device, which has a potential to overcome the difficulties faced by graphene RF FETs.

Since the hot electron transistor concept does not rely on the electric field effect, a graphene sheet used in a base layer of the GBT may in principle contain several carbon sheets. The ultimate thickness of graphene sheet will be a compromise between the graphene deposition technique and the quantum transmission coefficient for electrons travelling across the sheet.

BRIEF DESCRIPTION OF THE DRAWINGS

Further embodiments are described in the following with reference to the figures.

FIG. 1 shows different aspects of an embodiment of a transistor in accordance with an embodiment of the invention based on a vertical arrangement of the transistor electrodes emitter, base, and collector, wherein FIG. 1(a) shows a schematic band structure as a function of position along a depth direction in absence of an operating voltage, FIG. 1(b) shows a schematic band structure as a function of position along a depth direction under application of an operating voltage, and FIG. 1(c) shows a schematic cross sectional view of the transistor.

FIGS. 2a, 2b show a valence and conduction band profile of an embodiment having a compositionally graded collector barrier layer in absence and under application of an operating voltage, respectively.

FIG. 7b shows a band diagram of an embodiment of a GBT according to the embodiment of FIG. 7a.

DETAILED DESCRIPTION

Figure 3A:
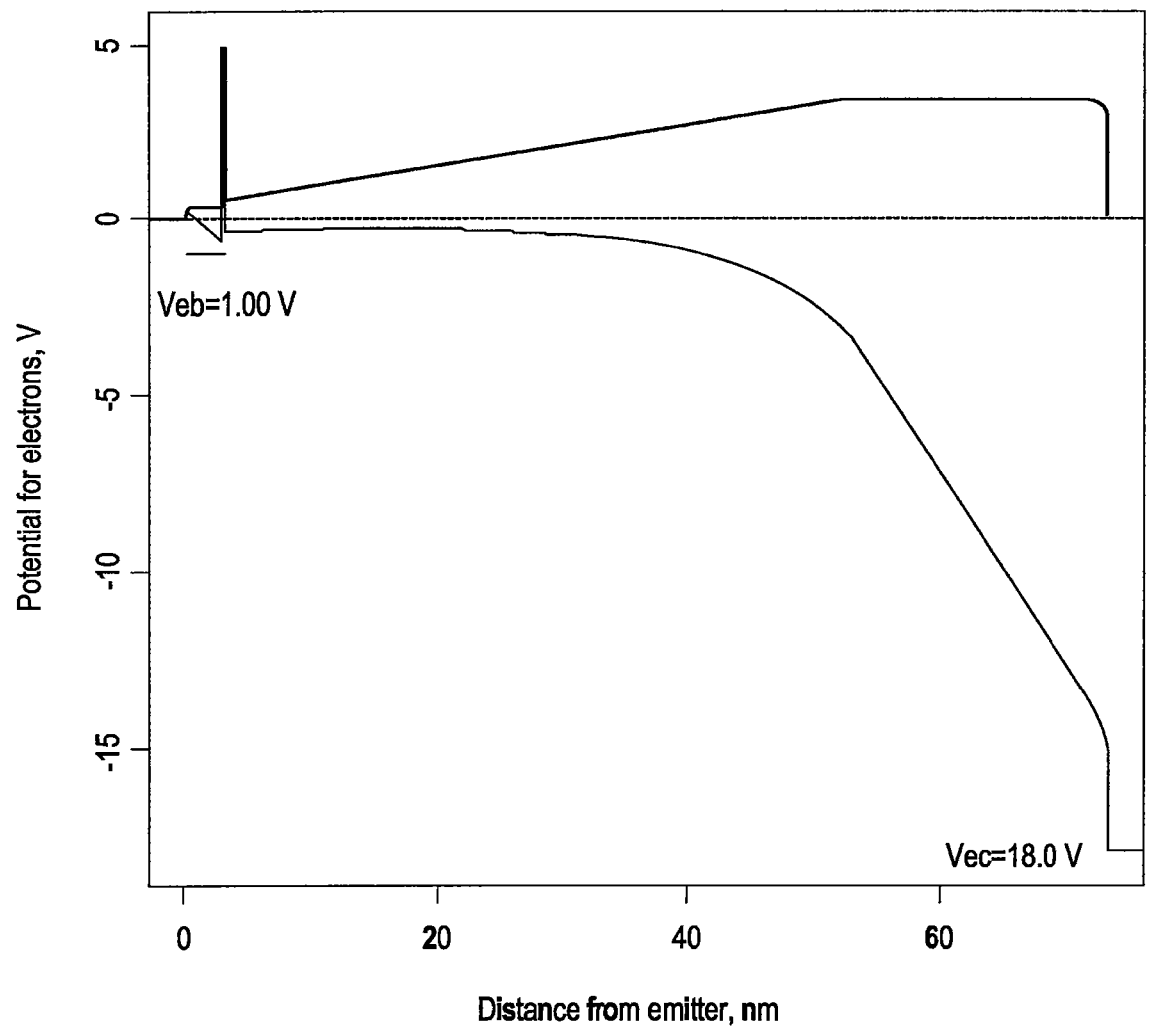
FIGS. 3a, 3b show calculated band profiles of an embodiment of a graphene base transistor (GBT) with a graded collector-base insulator under different conditions.

As shown in FIG. 1, the device concept is based on a vertical arrangement of the transistor electrodes emitter, base, and collector.

From an electrical point of view, the device works similarly to the hot electron transistor and also to the heterojunction bipolar transistor, or simply to a vacuum triode. This is shown with reference to FIGS. 1b and 1c. An emitter-base diode acts as an electron emitter injecting hot electrons across the base layer (graphene) into the conducting band of the collector barrier layer, which takes the form of an insulating layer placed between the base and the collector and in the following will also be referred to in short as BCI or BCI layer. The electrons leave the emitter by Fowler-Nordheim quantum tunnelling through an emitter barrier layer, which is allow referred to as emitter-base insulator, EBI layer or EBI.

The BCI can be much thicker than the EBI, so that it may receive a sufficiently high collector voltage. The graphene base works as the control electrode (grid in a vacuum tube). Ballistic transport across the base is expected, so the transparency is limited only by quantum effects. At the same time, the base resistance is very low, despite its extremely small thickness: in contrast to ultrathin metal films, graphene covers the insulator in form of a closed sheet, with no pinholes that would increase the resistivity and lateral scattering. This leads to a very high gain and extremely low base current. As argued below, the BCI layer can be designed in such a way that significantly higher voltages can be applied between the base and the collector electrode than it is possible in common transistors based on silicon. This is advantageous for the power performance of the device.

Electrons injected from the emitter should be transmitted across the BCI with as small hindrance as possible. In the ideal case, they should cross the BCI in a ballistic process. This is in some conflict with the requirement that, for good power performance, the BCI should withstand VBC voltages of the order of 10 V.

A possible solution is sketched in FIG. 2. FIG. 2 shows a valence and conduction band profile of a compositionally graded collector barrier layer BCI for (a) $V_{BC}=0$ (FIG. 2a) and (b) $V_{BC}=V_{BC}^{OUT}$ (FIG. 2b). BCI is designed to consist of two regions. The region described in FIG. 2a as "constant barrier" can be a common $SiO_2$ film, while the region described as "graded barrier" can be a silicate with the metal (e.g., Ti) content gradually increasing from zero at the $SiO_2$ boundary. The shape of the barrier can be designed in this way and optimized such that when the output voltage is applied (FIG. 2b) the collector current is not dramatically affected by a tunnelling barrier and/or by quantum reflections and still there is no BCI breakdown hazard. The disadvantage of lower electron mobility in a silicate/silica BCI ($\mu SiO_2 \sim 20$ cm$^2$/Vs) compared to Si is compensated by a the possibility to use a thinner film: the breakdown voltage of $SiO_2$ is at $E_{krit}$ around $6 \times 10^6$ V/cm about two orders of magnitude higher than for Si.

Figure 3B:
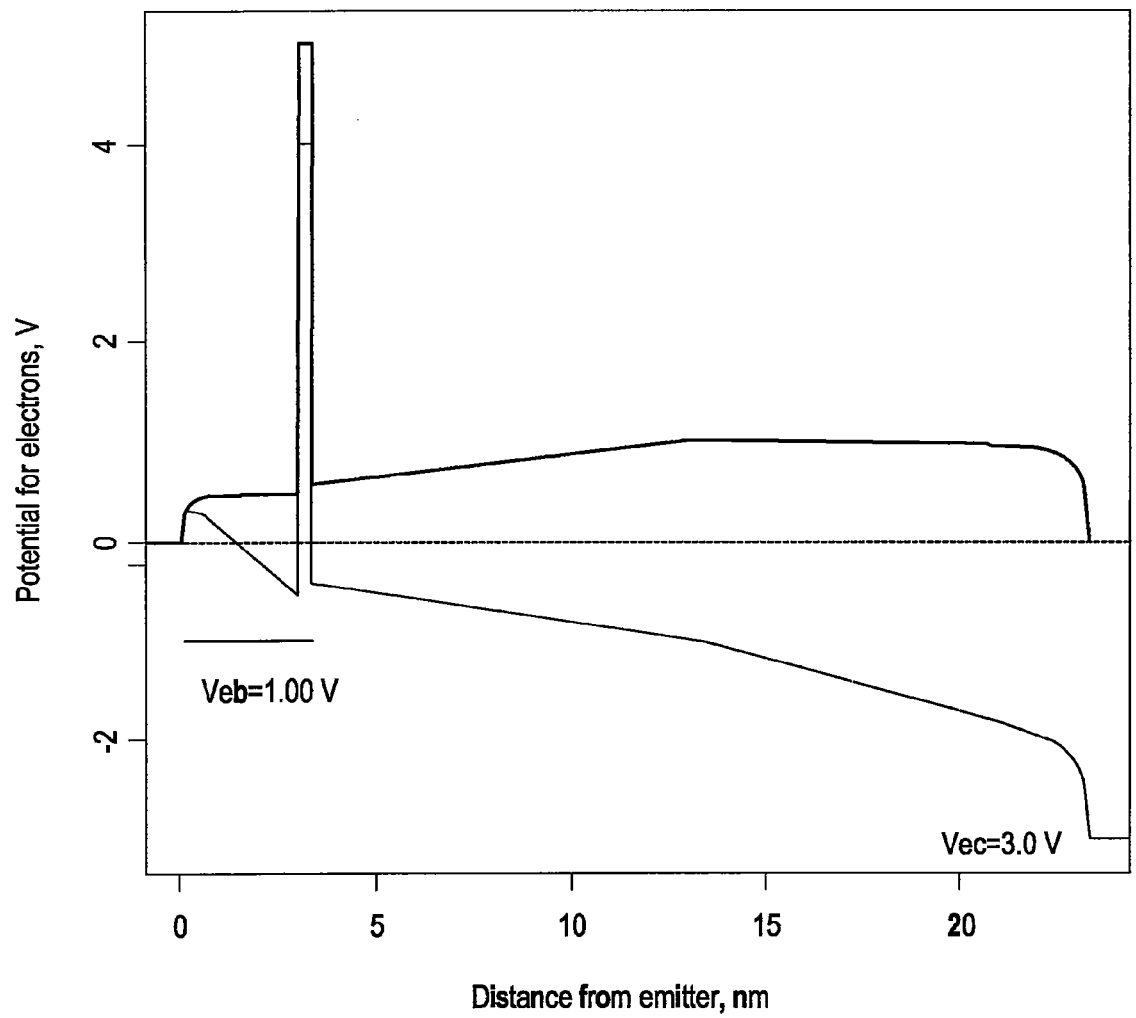

FIG. 3 shows realistic band diagrams of the BCI (a) designed for operation at a high output (collector) voltage, and (b) designed for operation at a moderate output voltage. FIG. 3 shows band profiles, also called band diagrams of the GBT with graded BCI. The emitter is on the right; the collector is on the left. A gray horizontal line at 0 V marks the Fermi level of the electrodes when no bias is applied, and the blue line is the potential in this case. The spike is the graphene layer. The emitter dielectric has the nominal barrier of 0.4 eV; the rounding on the emitter side is due to the image force. The collector dielectric consists of two parts: a graded part on the base side and a homogeneous part on the collector side. FIG. 3 (a) shows an embodiment of a High output voltage design. The BCI barrier at the interface to graphene is assumed to be 0.6 eV and the dielectric constant in the graded buffer is assumed to change linearly from 4 at the $SiO_2$ (collector) side to 50 at the $TiO_2$ (graphene) side. The red line is the potential when 1.0 V is applied between emitter and base, and 15 V is applied between emitter and collector. The electric field in the SiO$_2$ region remains below the critical field of $6 \cdot 10^6$ V/cm.

FIG. 3 (b) shows an embodiment of a Moderate output voltage design. The emitter dielectric has the nominal barrier of 0.5 eV; the rounding on the emitter side is due to the image force. The collector dielectric consists of two parts. The BCI barrier is assumed to be 0.6 eV at the interface to graphene and 1.0 eV at the interface to the collector electrode. The dielectric constant in the graded buffer is assumed to be constant throughout the BEC. The red line is the potential when 1.0 V is applied between emitter and base, and 3.0 V is applied between emitter and collector.

The device is expected to work in the THz regime. Tunnelling is known to be a very fast process, in the sense that the current response to of a tunnelling diode at a frequency as high as 2.5 THz can still resemble the dc curve. Emitter-base currents of the order of some mA and the EBI conductance of the order of some odd ten of mS can be possibly achieved with a 1 mm$^2$ device, meaning that the emitter-base injection can be fast enough. The transport across the rest of the structure can be ballistic, indicating that the characteristic delays there can be shorter than a pico-second.

Figure 4:
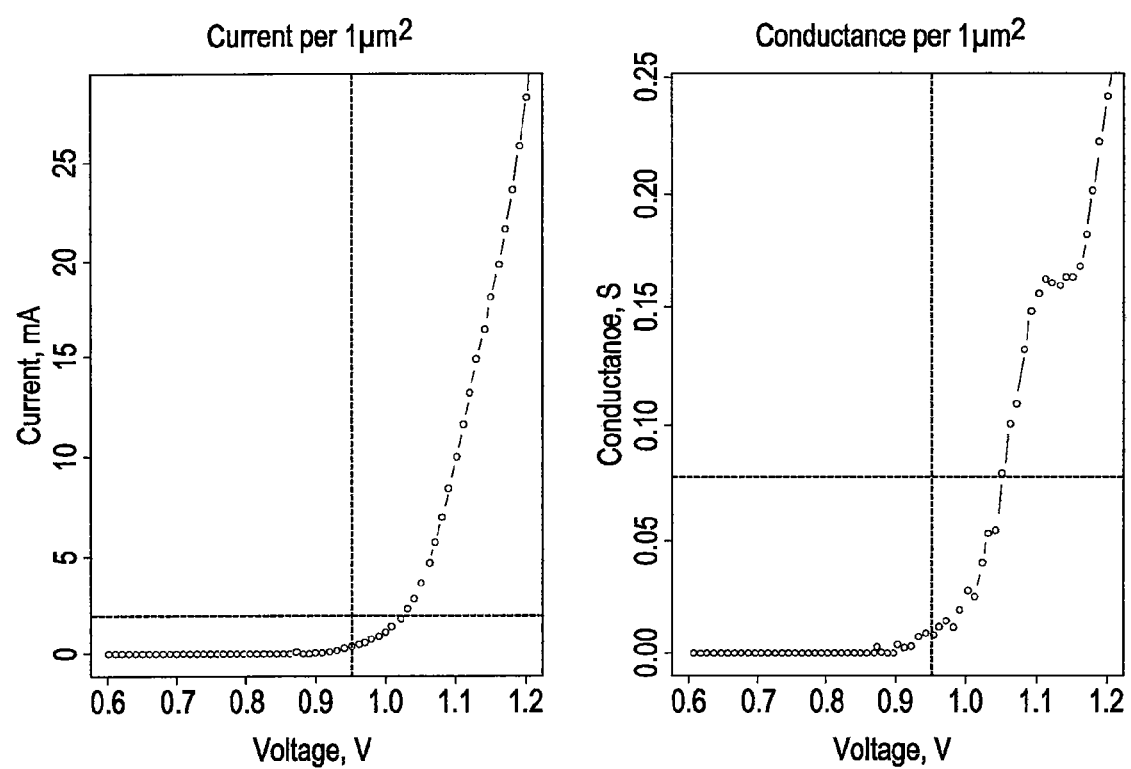
FIG. 4 shows transfer characteristics of an embodiment of a GBT with 3 nm EBI.

FIG. 4 shows characteristics of a GBT with 3 nm EBI. The collector current (right panel) and the transconductance (left panel) are plotted Transfer as a function of the emitter-base voltage for the emitter-collector bias of 10 V. The horizontal grey line marks the current of 2 mA (right panel) and the transconductance of 1/13 S (left panel) estimated as needed for 100 GHz operation. The vertical grey line is drawn at 0.95 V (would be of advantage to circuit design if these target values are achieved at this voltage). The area of the device is assumed to be 1μ$^2$. The target parameters are in this case reached at the base voltage of 1.05 V. FIG. 4 illustrates the ability of GBT to work in the high frequency regime. With a 3 nm EBI and the device area of μm$^2$, parameters required for operation at 100 GHz may be achieved. Further lowering of the EBI thickness (e.g., 2 nm are still realistic from technical point of view) should allow one to cross the Terahertz boundary.

Figure 5:
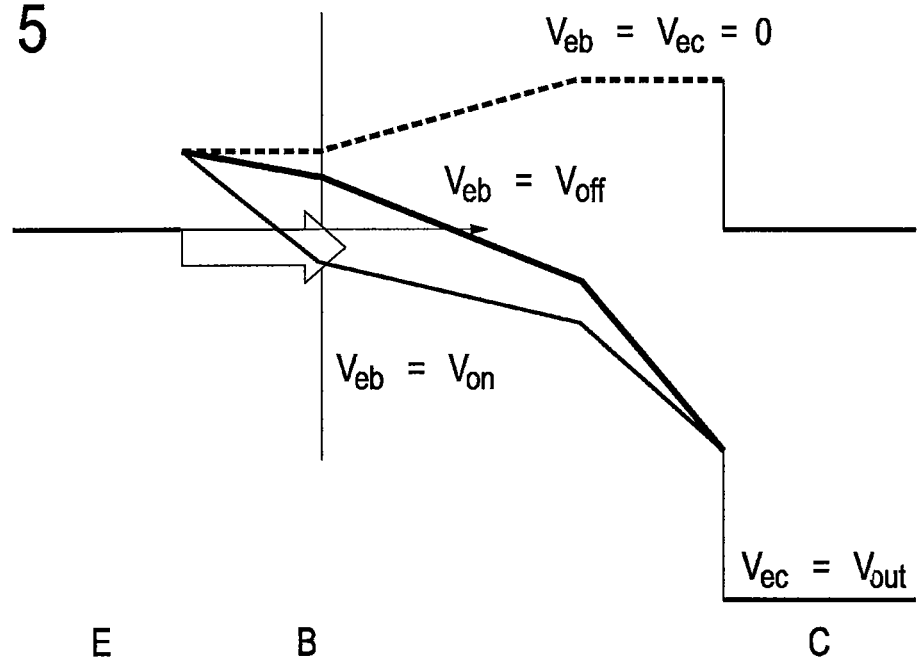
FIG. 5 shows a band diagram illustrating the possibility to switch the GBT off by lowering the base bias from $V_{on}$ to $V_{off}$.
Figure 6:
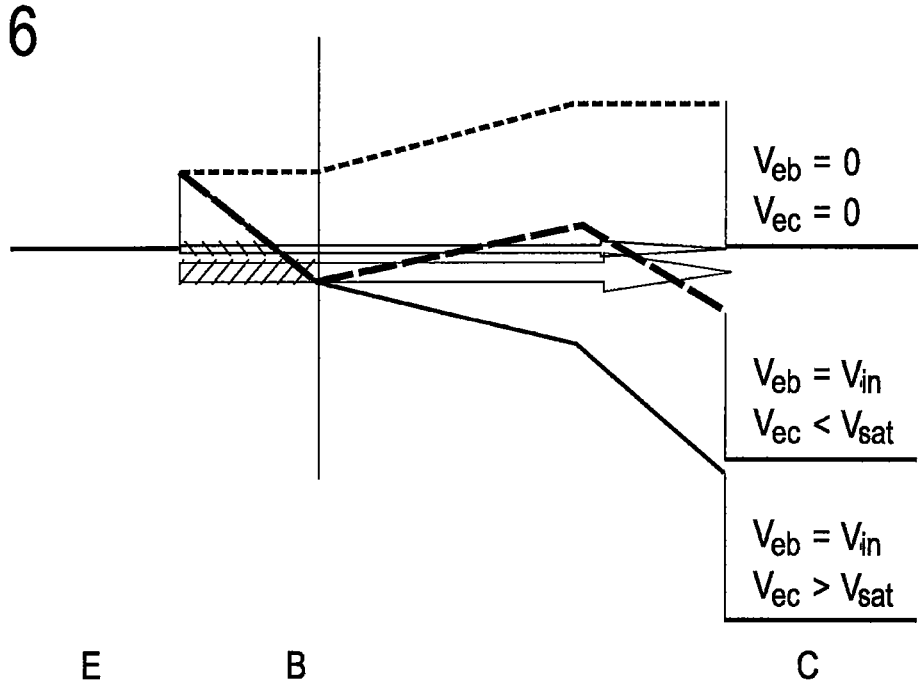
FIG. 6 shows a band diagram illustrating the origin of the collector current saturation of GBT at output voltages above $V_{sat}$.

This new graphene transistor concept presents a significant improvement in that it overcomes the prevailing disadvantages of graphene FETs, namely the very high $I_{off}$ (FIG. 5) and the lack of current saturation (FIG. 6). FIG. 5 shows a band diagram illustrating the possibility to switch the GBT off by lowering the base bias from $V_{on}$ to $V_{off}$. By varying the base voltage, one modifies the tunnelling barrier. Since the collector dielectric can be much thicker than the emitter dielectric, the device can be designed for low off current.

FIG. 6 shows a band diagram illustrating the origin of the collector current saturation of GBT at output voltages above $V_{sat}$. The electrodes are indicated as E, B, and C. The graphene basis is marked symbolically by a grey vertical bar. When the output voltage is below the saturation value (green), the collector current is limited by tunnelling under the collector dielectric and the current varies strongly with the collector bias. When the output voltage is above the saturation value (red), the collector dielectric has little influence on the current and the output current dependence on the output voltage is weak.

Figure 7A:
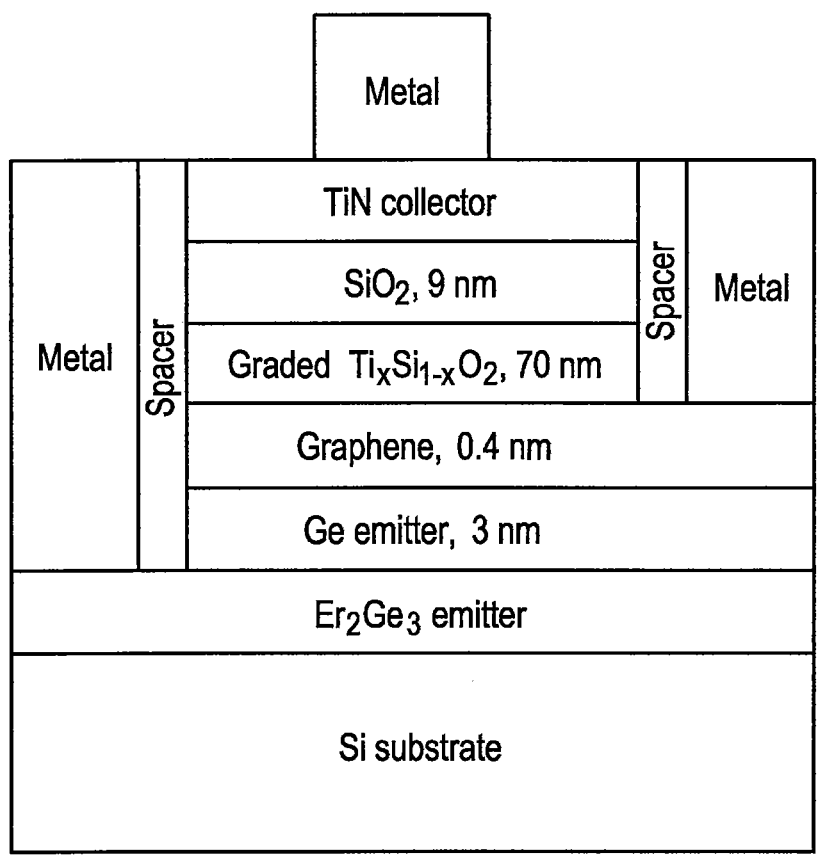
FIG. 7a shows a schematic cross sectional view of an embodiment of a GBT.
Figure 7B:
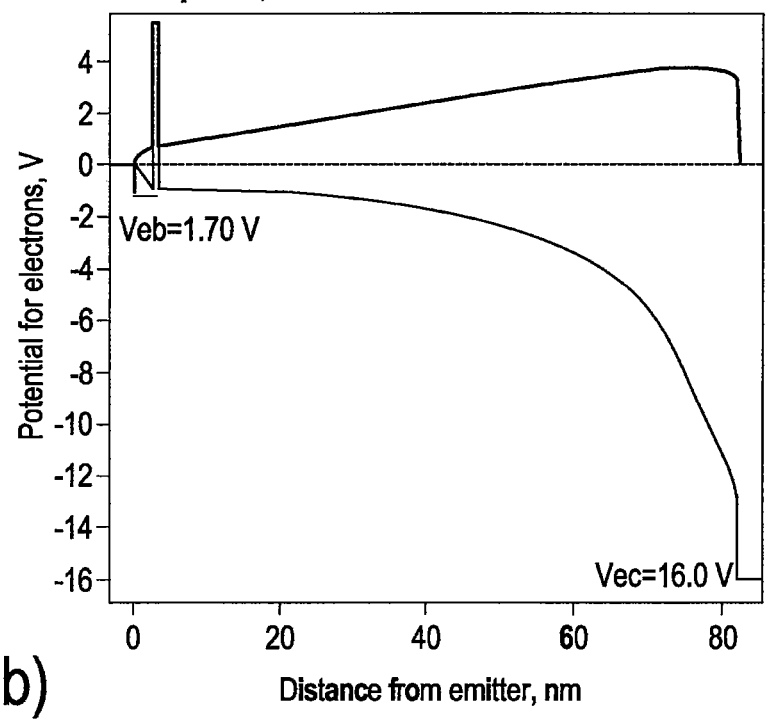

FIG. 7 shows a schematic sketch of the physical design and the band diagram of an embodiment of a GBT according to the present invention. The blue line is the potential for electrons at zero voltage, the red line is the potential for electrons at 1.7 eV between emitter and base and 16 V between emitter and collector. Flatband voltage of −0.55 eV between a graphene base (work function about 4.6 eV) and an erbium germanide Er$_2$Ge$_3$ emitter (work function about 4.05 eV) and unpinned Ge/Er$_2$Ge$_3$ interface are assumed.

Figure 8:
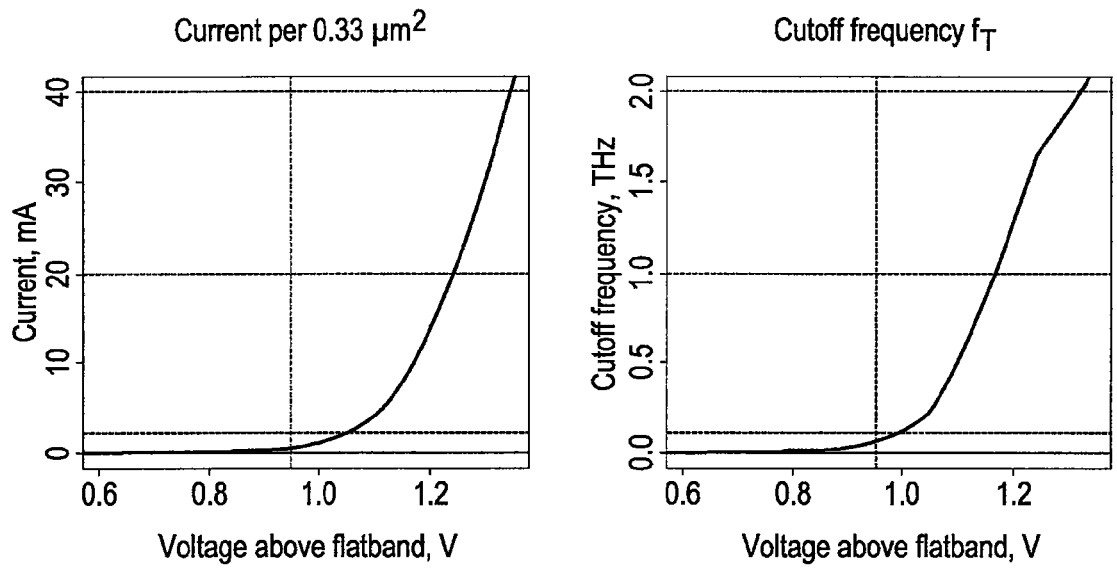
FIG. 8 shows diagrams of the current and the cutoff frequency as a function of applied voltage for the embodiment of FIG. 7

For THz performance one needs low EBI barrier, small effective mass of electrons in the EBI and high density of states in the emitter. The latter requirement strongly indicates that intrinsically metallic emitters should be used. The low-barrier requirement means in practice that the interface between the metal and the EBI should be unpinned and the work function of the emitter should be close to that of the EBI electron affinity. It seems that a workable solution can be: a Ge(001) film for the EBI and Er$_2$Ge$_3$ emitter. It is known that the interface between germanium and a germanide electrode (and also silicon and a silicide electrode) can be efficiently unpinned by certain atoms, as sulphur, selenium, aluminium, or phosphorus. The work function of Er$_2$Ge$_3$ (4.05 eV) matches the electron affinity of germanium (4.0 eV). The effective mass of electrons in the Δ minimum of germanium conduction band, i.e., for electrons travelling along the (001) direction, is 0.082. Assuming that when erbium germanide is used as the emitter, the Ge/emitter interface can be unpinned as efficiently as in the PrGe case (where the Schottky barrier to n-type Ge can be reduced to 0.16 eV), and that a Ge(001) EBI can be grown on the germanide (e.g., by an overgrowth process from Ge side wall), we propose a GBT structure as sketched in FIG. 7 (a). The corresponding band diagram is shown FIG. 7 (b) in the left panel. The dimensions are selected such that the device can work in THz regime, as estimated in FIG. 8.

If the transparency of graphene to electrons assumed in the simulation is correct, the device is able to function at frequencies in the THz regime. Higher cut-off frequency is realized by shifting the working point to higher base bias, whereby a reduction of device area becomes possible: the bias of 1.3 V and area of 0.33 μm$^2$ is necessary for 2 THz operation, and 1 THz can be achieved already at 1.15 eV and with 0.5 μm$^2$.

As mentioned above, the transparency of graphene to electrons may be the important factor limiting the high-frequency performance of the device. This transparency is in turn limited by the band structure of graphene: only the electrons penetrating the graphene under a significant angle, i.e., with a lateral momentum close enough to that of the Dirac point, see graphene as a narrow-gap insulator or even as a metal. For all other electrons, graphene is an insulator with a wide band gap; in particular, for electrons entering the graphene nearly perpendicularly to the surface, the band gap is around 5 eV. The exact impact of this effect on the collector current depends on the band diagram of the device at the working point, but it cannot be excluded that the wide band gap of graphene at ⌈ will become an issue when the operation frequency is pushed well into the THz regime. A possible solution of this problem may be provided by materials similar to graphene: silicone and germanene. The stability of these materials has been predicted theoretically; the important point here is that although their band structure is qualitatively the same as that of graphene, their band gap at ⌈ is significantly lower (as is the band gap at ⌈ lower for germanium and silicon, in comparison to diamond or graphite).

Besides digital logic the most important application of a THz transistor will be its operation as a high-frequency linear small-signal amplifier. A small-signal amplifier receives and generates AC signals which are small compared to the transistor's DC bias voltages rsp. currents. Under the small-signal signalling regime the transistor is considered to be a linear amplifier with constant electrical parameters such as e.g. transconductance, R-parasitics, C-parasitics etc. In the following we develop a simple low-frequency and high-frequency small-signal model of the GBT including the most important R- and C-parasitics. From the high-frequency small-signal model we will calculate the transit frequency $f_T$ as an important figure of merit. This will allow to assess the potential of the GBT concept with state-of-the-art high-frequency transistors and yields transistor design rules for a maximum device cut-off frequency.

Figure 9:
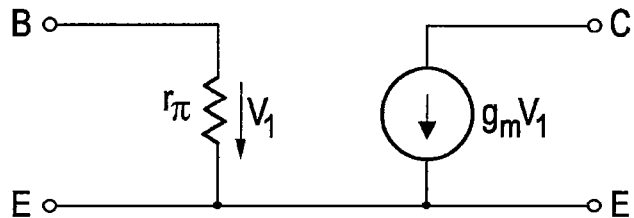
FIG. 9a shows a simple low-frequency small-signal model of the transistor without taking into account R- and C-parasitics.
FIG. 9b shows a high-frequency small-signal transistor model of an embodiment of the GBT with metal emitter and metal collector.
FIG. 9c shows a further transistor model of an embodiment of the GBT.
Figure 9:
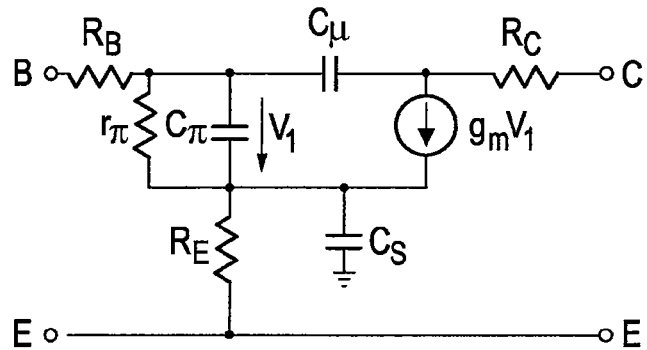
Figure 9:
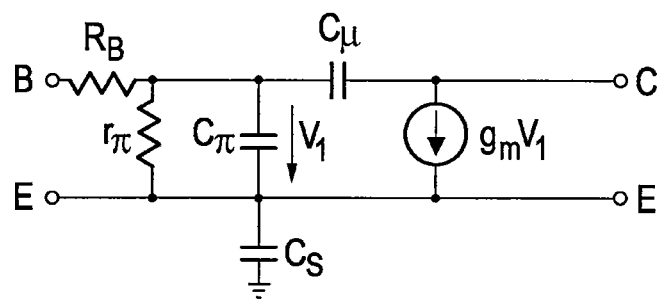

A simple low-frequency small-signal model of the transistor without R- and C-Parasitics is given in FIG. 9a. The transconductance $g_m$ is defined as $$g_m = \partial i_C / \partial v_1 = \beta_0 \partial i_B / \partial v_1 = \frac{\beta_0}{\beta_0 + 1} \partial i_E / \partial v_1, \quad (1)$$

with $i_c$ being the small-signal collector current and $v_1$ denoting the small-signal voltage from node B to E. The well known small signal current gain $\beta_0$ is defined as $\beta_0 = i_c/i_b$. We assume that $\beta_0$ is much higher than 1 because most of the emitter current will transit through the very thin graphene base layer directly to the collector. For $\beta_0 \gg 1$ the transconductance $g_m$ is approximately $$g_m = \partial i_C/\partial v_1 \approx \partial i_E/\partial v_1, \quad (2)$$

which represents the derivation of the tunnel diode current wrt. the diode voltage. Thus the transconductance of the GBT is basically the differential conductance of its tunnel diode.

Given (2) the differential input resistance $r_\pi$ becomes $$r_\pi = [\partial i_B / \partial v_1]^{-1} = [\partial (i_C/\beta_0)/\partial v_1]^{-1} = \frac{\beta_0}{g_m}. \quad (3)$$

Since we have no means to estimate $\beta_0$ at this point, we cannot calculate the $r_\pi$. However it can be shown that for the estimation of most of the high-frequency parameters (including $f_T$) the low-frequency input impedance $r_\pi$ is not needed.

FIG. 9b shows a high-frequency small-signal transistor model of the GBT with metal emitter and metal collector. It includes all R- and C-parasitics of the GBT. $R_B$ denotes the resistance of the base contact as well as the graphene layer. $R_C$ represents the collector contact resistance while $R_E$ consists of the emitter contact resistance.

According to [M. Matsumura and Y. Hirose, "Extraction of the Capacitance of a Metal Oxide Semiconductor Tunnel Diode (MOSTD) Biased in Accumulation", Jpn. J. Appl. Phys. 1999, vol. 38, pp-184-1847] a metal-oxide-silicon tunnel diode exhibits a plate capacitance between metal and semi-conductor layer as well as an accumulation (or depletion) capacitance in silicon. If the silicon cathode is replaced by a metal cathode (emitter) there is no accumulation (or depletion) capacitance due to the conducting behaviour of the metal cathode (emitter). Moreover if graphene is understood as a metal-like conductor we can model $C_\pi$ as a plate capacitance between base and emitter. Furthermore a substrate capacitance $C_S$ exists between emitter electrode and ground while $C_\mu$ is the base collector plate capacitance representing a metal-insulator-metal (MIM) capacitance.

The equivalent circuit from FIG. 9c can be simplified with the assumption that $R_E$ and $R_C$ are so small that their contribution to DC and AC performance of the GBT is small. Neglecting $R_E$, $R_C$, we can redraw the equivalent circuit from FIG. 9a) as shown in FIG. 9b).

The $f_T$ of the transistor equivalent circuit from FIG. 9b) can be calculated [Gray, Meyer "Analysis and Design of Analog Integrated Circuits", Wiley 2001] to $$f_T = \frac{1}{2\pi} \frac{g_m}{C_\pi + C_\mu}. \quad (4)$$

Note that according to equation (4) only the three parameters $C_\pi$, $C_\mu$, and $g_m$ determine $f_T$. Interestingly $R_B$, $r_\pi$, $\beta_0$, and $C_S$ have no influence on $f_T$ which is similar to the high-frequency behaviour of the bipolar transistor [Gray,Meyer]. The area of the $C_\pi$ and $C_\mu$ is approximately the same while the thickness of the BE $SiO_2$ layer is much thinner than the $SiO_2$ layer between base and collector. Hence $C_\pi$ is much higher than $C_\mu$ and we can simplify $f_T$ to be approximately $$f_T \approx \frac{1}{2\pi} \frac{g_m}{C_\pi}. \quad (5)$$

Equation (5) represents a simple relation for a first order optimization $w_{rt}$ maximum transistor speed. Small-signal transconductance $g_m$ rises with DC bias current $I_C$. Since $C_\pi$ is proportional to the emitter area it makes sense to chose a high bias current $I_C$ with an as small as possible emitter area. Besides that, the thickness $t_{ox,BE}$ of the base emitter $SiO_2$ layer has an influence on both the DC tunnel current as well as $C_\pi$. It should be noted that while the tunnel current rises approximately proportional to $t_{ox,BE}^2$ $C_\pi$ decreases with $1/t_{ox,BE}$. Hence $f_T$ is approximately proportional to $t_{ox,BE}$ so that a small $t_{ox,BE}$ is desirable. Summarizing these observations we can conclude that the GBT can be optimized for high $f_T$ by maximizing its current density and reducing $t_{ox,BE}$.

What is claimed is:

1. A junction transistor, comprising, on a substrate an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer, wherein the collector barrier layer is a compositionally graded material layer, which has an electron affinity that decreases in a direction pointing from the base layer to the collector layer and which has a dielectric constant that decreases with increasing distance from the base layer in the direction pointing from the base layer to the collector layer.

2. The junction transistor of claim 1, wherein the collector barrier layer comprises a $Ta_2O_5$ layer adjacent to the collector layer, and a $Ta_xTi_{1-x}O$ layer adjacent to the base layer, wherein x increases with increasing distance from the barrier layer.

3. The junction transistor of claim 1, wherein a dielectric constant of the collector barrier layer decreases from a value between 40 and 60 at an interface between the graphene layer and the collector barrier layer, to a value between 3 and 5 at an interface between the collector barrier layer and the collector.

4. The junction transistor of claim 1, wherein the emitter layer comprises a titanium nitride layer.

5. The junction transistor of claim 1, wherein the emitter layer comprises a $Er_2Ge_2$ layer.

6. The junction transistor of claim 5, wherein the emitter barrier layer comprises, arranged adjacent to the titanium nitride layer, a layer of Si, in particular Si (001), Ge, in particular Ge (001), GaAs, $Ta_2O_5$, or $TiO_2$.

7. The junction transistor of claim 1, wherein the a layer stack formed by the emitter layer and the emitter barrier layer comprises a $n^{++}$-Si(001)/i-Si(001) layer stack, a $n^{++}$-Ge (001)/i-Ge(001) layer stack, or a $n^{++}$-GaAs(001)/i-GaAs (001) layer stack, or an $Er_2Ge_2$/Ge layer stack.

8. The junction transistor of claim 7, wherein the emitter barrier layer comprises between 1 and 10 monolayers of BN arranged adjacent to the graphene layer.

9. The junction transistor of claim 4, wherein the emitter barrier layer comprises, arranged adjacent to the titanium nitride layer, a layer of Si, in particular Si (001), Ge, in particular Ge (001), GaAs, $Ta_2O_5$, or $TiO_2$.

10. A junction transistor, comprising, on a substrate an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer, wherein the collector barrier layer is a compositionally graded material layer, which has an electron affinity that decreases in a direction pointing from the base layer to the collector layer, and wherein the electron affinity of the collector barrier layer decreases linearly with increasing distance from the base layer.

11. The junction transistor of claim 10, wherein the collector barrier layer comprises a sub-layer arranged adjacent to the collector layer and having an electron affinity that does not change with increasing distance from the base layer.

12. The junction transistor of claim 11, wherein the sub-layer comprises a silicon dioxide layer at the interface between the collector barrier layer and the collector.

13. The junction transistor of claim 12, wherein the collector barrier layer further comprises a $Si_xTi_{1-x}O_2$ layer between the silicon dioxide layer and the base layer, wherein x increases with increasing distance from the base layer.

14. The junction transistor of claim 13, wherein the silicon dioxide layer has a thickness of between 5 and 30 nanometer, and the $Si_xTi_{1-x}O_2$ layer, if present, has a thickness of between 10 and 90 nanometer.

15. The junction transistor of claim 12, wherein the silicon dioxide layer has a thickness of between 5 and 30 nanometer, and the $Si_xTi_{1-x}O_2$ layer, if present, has a thickness of between 10 and 90 nanometer.

16. A junction transistor, comprising, on a substrate an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer, wherein the collector barrier layer is a compositionally graded material layer, which has an electron affinity that decreases in a direction pointing from the base layer to the collector layer, and wherein the collector barrier layer comprises a sub-layer arranged adjacent to the collector layer and having an electron affinity that does not change with increasing distance from the base layer.

* * * * *